US012541152B2

(12) United States Patent
Chen et al.

(10) Patent No.: US 12,541,152 B2
(45) Date of Patent: Feb. 3, 2026

(54) EUV LITHOGRAPHY SYSTEM WITH 3D SENSING AND TUNNING MODULES

(71) Applicant: Taiwan Semiconductor Manufacturing Company, Ltd., Hsinchu (TW)

(72) Inventors: Tai-Yu Chen, Hsinchu (TW); Tzu-Jung Pan, New Taipei (TW); Kuan-Hung Chen, Taoyuan (TW); Sheng-Kang Yu, Hsinchu (TW); Shang-Chieh Chien, New Taipei (TW); Li-Jui Chen, Hsinchu (TW); Heng-Hsin Liu, New Taipei (TW)

(73) Assignee: TAIWAN SEMCONDUCTOR MANUFACTURING COMPANY, LTD., Hsinchu (TW)

( * ) Notice: Subject to any disclaimer, the term of this patent is extended or adjusted under 35 U.S.C. 154(b) by 243 days.

(21) Appl. No.: 18/524,876

(22) Filed: Nov. 30, 2023

(65) Prior Publication Data
US 2024/0103378 A1    Mar. 28, 2024

Related U.S. Application Data

(63) Continuation of application No. 17/805,695, filed on Jun. 7, 2022, now Pat. No. 11,852,978.
(Continued)

(51) Int. Cl.
G03F 7/20 (2006.01)
G03F 7/00 (2006.01)
H05G 2/00 (2006.01)

(52) U.S. Cl.
CPC ....... *G03F 7/70091* (2013.01); *H05G 2/0084* (2024.08)

(58) Field of Classification Search
CPC ............. G03F 7/70091; G03F 7/70133; G03F 7/7055; G03F 7/70558; G03F 7/7085;
(Continued)

(56) References Cited

U.S. PATENT DOCUMENTS 8,598,552 B1    12/2013 Frihauf et al.
8,796,666 B1    8/2014 Huang et al.
(Continued)

FOREIGN PATENT DOCUMENTS

CN    110837209 A    2/2020
CN    113267963 A    8/2021
(Continued)

*Primary Examiner* — Mesfin T Asfaw
(74) *Attorney, Agent, or Firm* — HAYNES AND BOONE, LLP

(57) ABSTRACT

The present disclosure provides an extreme ultraviolet (EUV) lithography system including a radiation source and an EUV control system integrated with the radiation source. The EUV control system includes a 3-dimensional diagnostic module (3DDM) designed to collect a laser beam profile of a laser beam from the radiation source in a 3-dimensional (3D) mode, an analysis module designed to analyze the laser beam profile, a database designed to store the laser beam profile, and an EUV control module designed to adjust the radiation source. The analysis module is coupled with the database and the EUV control module. The database is coupled with the 3DDM and the analysis module. The EUV control module is coupled with the analysis module and the radiation source.

20 Claims, 14 Drawing Sheets

Related U.S. Application Data

(60) Provisional application No. 63/317,142, filed on Mar. 7, 2022.

(58) Field of Classification Search
CPC ............ G03F 7/70033; G03F 7/70491; H05G 2/0084; H01L 21/0274
See application file for complete search history.

(56) References Cited

U.S. PATENT DOCUMENTS

| | | |
|---|---|---|
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 9,869,934 B2 | 1/2018 | Huang et al. |
| 9,869,939 B2 | 1/2018 | Yu et al. |
| 2010/0140512 A1 | 6/2010 | Suganuma et al. |
| 2016/0054174 A1 | 2/2016 | Senekerimyan et al. |
| 2017/0010540 A1 | 1/2017 | Dmitriev et al. |
| 2018/0284617 A1 | 10/2018 | Nishimura et al. |
| 2019/0094717 A1 | 3/2019 | Yang et al. |
| 2020/0057382 A1 | 2/2020 | Hsieh |
| 2020/0073251 A1 | 3/2020 | Smith et al. |
| 2021/0262944 A1 | 8/2021 | Juschkin et al. |

FOREIGN PATENT DOCUMENTS

| | | |
|---|---|---|
| CN | 113391523 A | 9/2021 |
| KR | 20190120809 A | 10/2019 |
| KR | 20200092962 A | 8/2020 |
| KR | 20220019033 A | 2/2022 |
| TW | 201215245 A | 4/2012 |
| TW | 202001406 A | 1/2020 |
| TW | 202021427 A | 6/2020 |

EUV LITHOGRAPHY SYSTEM WITH 3D SENSING AND TUNNING MODULES

This application is a continuation of U.S. Non-Provisional patent application Ser. No. 17/805,695, filed on Jun. 7, 2022, which claims priority to U.S. Provisional Application 63/317,142 entitled "SYSTEM AND METHOD FOR LITHOGRAPHY 3D PLASMA DIAGNOSTICS," filed Mar. 7, 2022, each of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). The EUVL employs scanners using light in the extreme ultraviolet (EUV) region, having a wavelength of about 1-100 nm. EUV scanners use reflective rather than refractive optics, i.e., mirrors instead of lenses. However, while existing lithography techniques have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
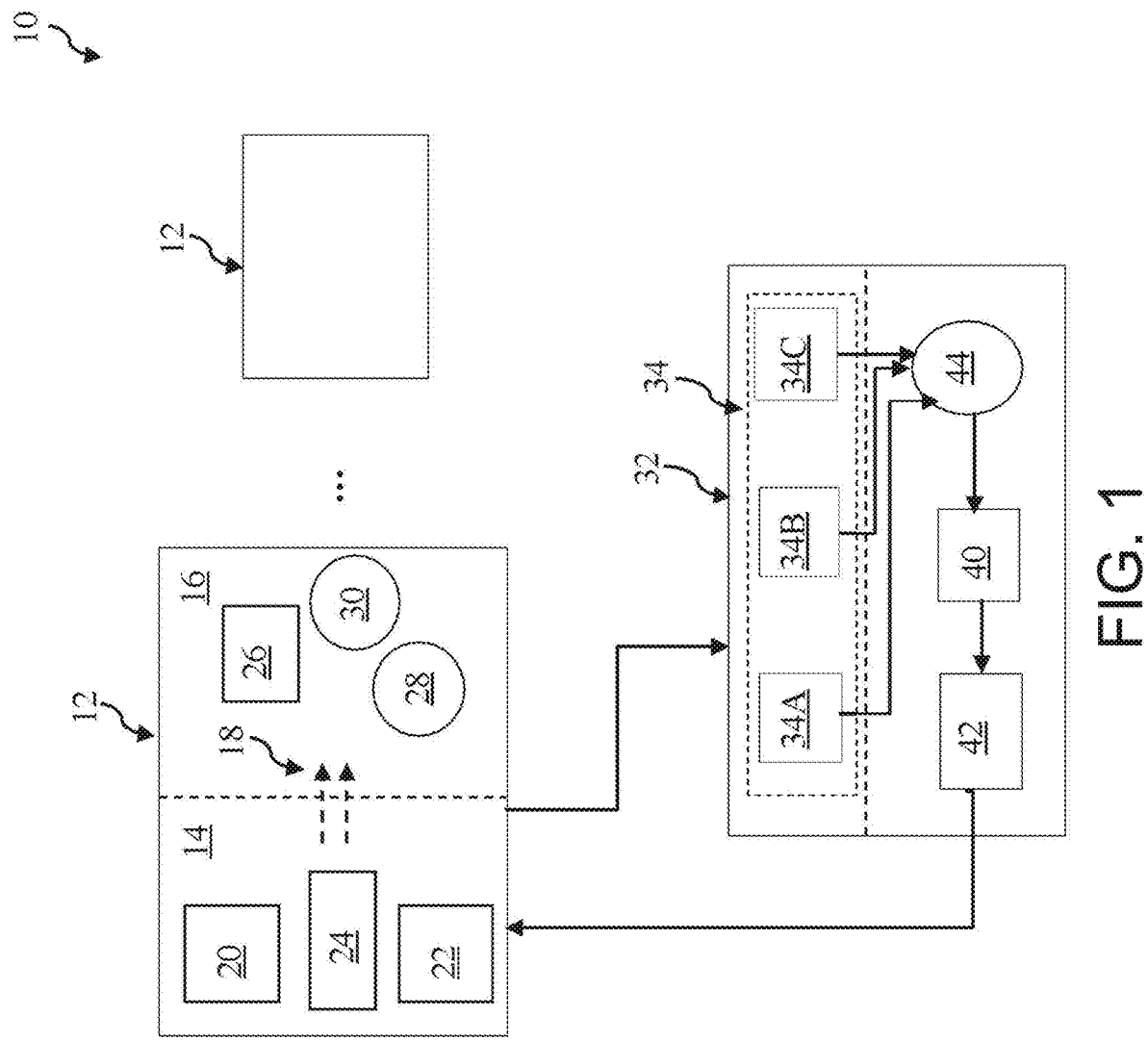
FIG. 1 is a block diagram of an EUV lithography system with an EUV control system, constructed in accordance with some embodiments.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one feature relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described, or other values as understood by person skilled in the art. For example, the term "about 5 nm" encompasses the dimension range from 4.5 nm to 5.5 nm.

The present disclosure is about an extreme ultraviolet (EUV) lithography apparatus integrated with an EUV control system that is designed to monitor, analyze, tune and control the EUV lithography apparatus for enhanced performance. The present disclosure also includes a method using the control system to monitor laser beam, plasma, contamination, EUV radiation, collect 3D diagnostics data thereof, analyze (including correlation, and machine learning), identify the root causes and actively tune and control parameters of the EUV lithography apparatus such that the lithography process is improved when the EUV lithography apparatus is used in integrated circuit (IC) fabrication. Especially, the method and EUV control system are associated with EUV lithography apparatus for patterning IC structures in advanced technology nodes. The IC structure may include field-effect transistors (FETs), fin FETs or multiple gate devices, such as gate-all-around (GAA) devices according to various embodiments.

FIG. 1 is a block diagram of a lithography system 10, constructed in accordance with some embodiments. The lithography system 10 may also be generically referred to as a scanner that is operable to perform lithography exposing processes with respective radiation source and exposure mode. In the present embodiment, the lithography system 10 is an extreme ultraviolet (EUV) lithography system designed to expose a resist layer by EUV light. The resist layer is a suitable material sensitive to the EUV light. The lithography system 10 includes one or more EUV lithography apparatus 12 designed to perform an exposure process using EUV radiation. An EUV lithography apparatus 12 includes an EUV source 14 (or simply referred to as source vessel 14) to generate EUV radiation 18 and an exposure chamber 16 designed to perform a lithography exposure process using the EUV radiation 18.

The radiation source 14 includes an enclosed space maintained in a hydrogen environment for protection and contamination reduction. The radiation source 14 includes various components configured to generate the EUV radiation 18. In the disclosed embodiment, the radiation source 14 includes a laser source 20 to provide a laser beam; a laser-produced plasma (LPP) module 22 to generate plasma using the laser beam; and an EUV module 24 to collect and focus the EUV radiation 18 generated by the plasma. The exposure chamber 16 is maintained in a vacuum environment to reduce undesired absorption of EUV radiation 18. The exposure chamber 16 may include a mask stage 28 to secure a photomask (or reticle), a wafer stage 30 to secure a semiconductor substrate (such as a wafer), and an EUV optics 26 designed to modulate the EUV radiation such that an image of the pattern or portion thereof defined on the photomask is directed onto the semiconductor substrate, or specifically onto a resist layer coated on the semiconductor substrate, according to various embodiments.

The lithography system 10 also includes a control system (or EUV control system) 32 integrated with the EUV lithography apparatus 12. The control system 32 is designed with mechanisms to monitor various parameters of the EUV lithography apparatus 12, collect 3D diagnostics data thereof, analyze the collected 3D data, identify root causes of any undesired issues, and actively tune and control variables of the EUV lithography apparatus 12 such that the EUV lithography apparatus 12 and the corresponding process are improved and enhanced when the EUV lithography apparatus 12 is utilized in integrated circuit (IC) fabrication.

The EUV control system 32 includes various units, modules, and components integrated and configured to perform various functions. Various portions of the EUV control system 32 may be distributed in various locations, such as being partially embedded and configured in the EUV lithography apparatus 12; or being partially standing alone and coupled with the EUV lithography apparatus 12 through Internet communication (such as Internet cable connection, WiFi connection, Bluetooth connection, other suitable connection or a combination thereof).

The EUV control system 32 includes various monitors 34 to monitor and collect various information associated with the EUV lithography apparatus 12, or specifically the radiation source 14 of EUV lithography apparatus 12. In the disclosed embodiment, the EUV control system 32 includes a laser monitor 34A configured and designed with a mechanism to monitor laser beam generated from the laser source 20; a plasma monitor 34B configured and designed with a mechanism to monitor the plasma generated by the laser beam; and an EUV monitor 34C configured and designed with a mechanism to monitor the EUV radiation 18 generated from the plasma. In some embodiments, the EUV control system 32 includes multiple sets of the above monitors (34A, 34B and 34C), each set being embedded in one corresponding EUV lithography apparatus 12 and connected to other components of the EUV control system 32. The EUV control system 32 may additionally or alternatively include one or more other monitors configured and designed to monitor other parameters, such as target droplet contamination, and plasma stability, to be collected and used in analyzing the radiation source 14.

Especially, various monitors 34 are designed and configured to collect 3D data associated with the radiation source 14, which is more effective to provide additional and sufficient information for analysis on the radiation source 14. Accordingly, the monitors 34 are collectively referred to as 3D diagnostics module (3DDM) 34. 3D means that the module 34 is able to monitor and collect the data in three-dimensional or more, such as two spatial dimensions plus time dimension, three spatial dimensions, or three spatial dimensions plus time dimension. When the time dimension is considered, the data are collected over a period of time in addition to over spatial variation of the corresponding parameter (such as laser light intensity, plasma intensity, or EUV radiation intensity). The 3DDM 34 provides a path to build a 3D diagnostics model with sufficient and relevant data for enhanced analysis, such as correlation analysis among the laser profile, plasma distribution and EUV radiation.

As mentioned above, the 3DDM 34 includes various units to monitor and collect different signals associated with the EUV source. Especially, 3DDM 34 is designed to collect 3D data, which can be achieved by various technologies available or future developed.

The laser monitor 34A includes any suitable technology sensible to the laser light from the laser source 20. In some embodiments, the laser monitor 34A includes one or more photodiodes sensible to the laser beam from the laser source 20 and configured to receive the laser beam. Especially, the laser monitor 34A is able to collect 3D data of the laser beam. For example, the laser monitor 34A includes a plurality of photodiodes configured in an array with a configuration such that laser beam from the laser source 20 can be effectively caught and collected. In other embodiments, the laser monitor 34A includes other suitable detectors (sensible to the laser beam from the laser source 20), such as photomultipliers, opto-isolators, integrated optical circuit (IOC) elements, photoresistors, photoconductive camera tubes, charge-coupled imaging devices, injection laser diodes, quantum cascade lasers, photo-emissive camera tube, or a combination thereof.

The plasma monitor 34B includes any suitable technology sensible to the plasma generated by the laser beam of the laser source 20 through the LPP module 22. In some embodiments, the plasma monitor 34B includes one or more Faraday rings sensible to the plasma (such as plasma density) generated by laser beam and configured to effectively monitor the plasma. Especially, the plasma monitor 34B is able to collect 3D data of the plasma, such as plasma density distribution. For example, the plasma monitor 34B includes a plurality of Faraday rings configured in an array with a configuration such that plasma generated from the LPP module 22 can be effectively collected. In other embodiments, the plasma monitor 34B includes other suitable detectors (sensible to the plasma density), such as light scattering detector, electron multiplier, or a combination thereof.

The EUV monitor 34C includes any suitable technology sensible to the EUV radiation 18 generated from the plasma. In some embodiments, the EUV monitor 34C includes one or more photodiodes sensible to the EUV radiation 18 and configured to receive the EUV radiation 18. The mechanism of the sensing unit of the EUV monitor 34C may be similar to that of the sensing unit of the laser monitor 34A since both sense photons but photons in different spectral ranges. In some examples, the EUV monitor 34C includes a plurality of photodiodes configured in an array with a configuration such that EUV radiation 18 from the plasma (e.g., specifically reflected from the EUV collectors) can be effectively collected. In other embodiments, the EUV monitor 34C includes other suitable detectors (sensible to the EUV radiation 18), such as photomultipliers, photoresistors, hybrid pixel detectors, other suitable devices, or a combination thereof.

Still referring to FIG. 1, the EUV control system 32 further includes other modules, such as an analysis module 40, a control module 42 and a database 44 integrated with the 3DDM 34. The database 44 is coupled with the 3DDM 34 such that the 3D data collected by 3DDM 34 are sent to and stored in the database 44. The analysis module 40 is coupled with the database 44 so that 3D data from 3DDM 34 are accessible by the analysis module 40. The analysis module 40 is designed with one or more mechanisms to effectively analyze the 3D data and find the root causes for any issues associated with the radiation source 14. The control module 42 is coupled with the analysis module 40 and is further coupled with the EUV lithography apparatus 12. The control module 42 is designed with one or more suitable mechanism to control the radiation source 14 of the EUV lithography apparatus 12 according to the result from the analysis module 40. In some examples, the control module 42 tunes the radiation source 14 of the EUV lithography apparatus 12 such that the EUV lithography apparatus 12 is adjusted to eliminate or reduce the identified issues, and EUV exposure process using the EUV lithography apparatus 12 is improved and enhanced.

Figure 2:
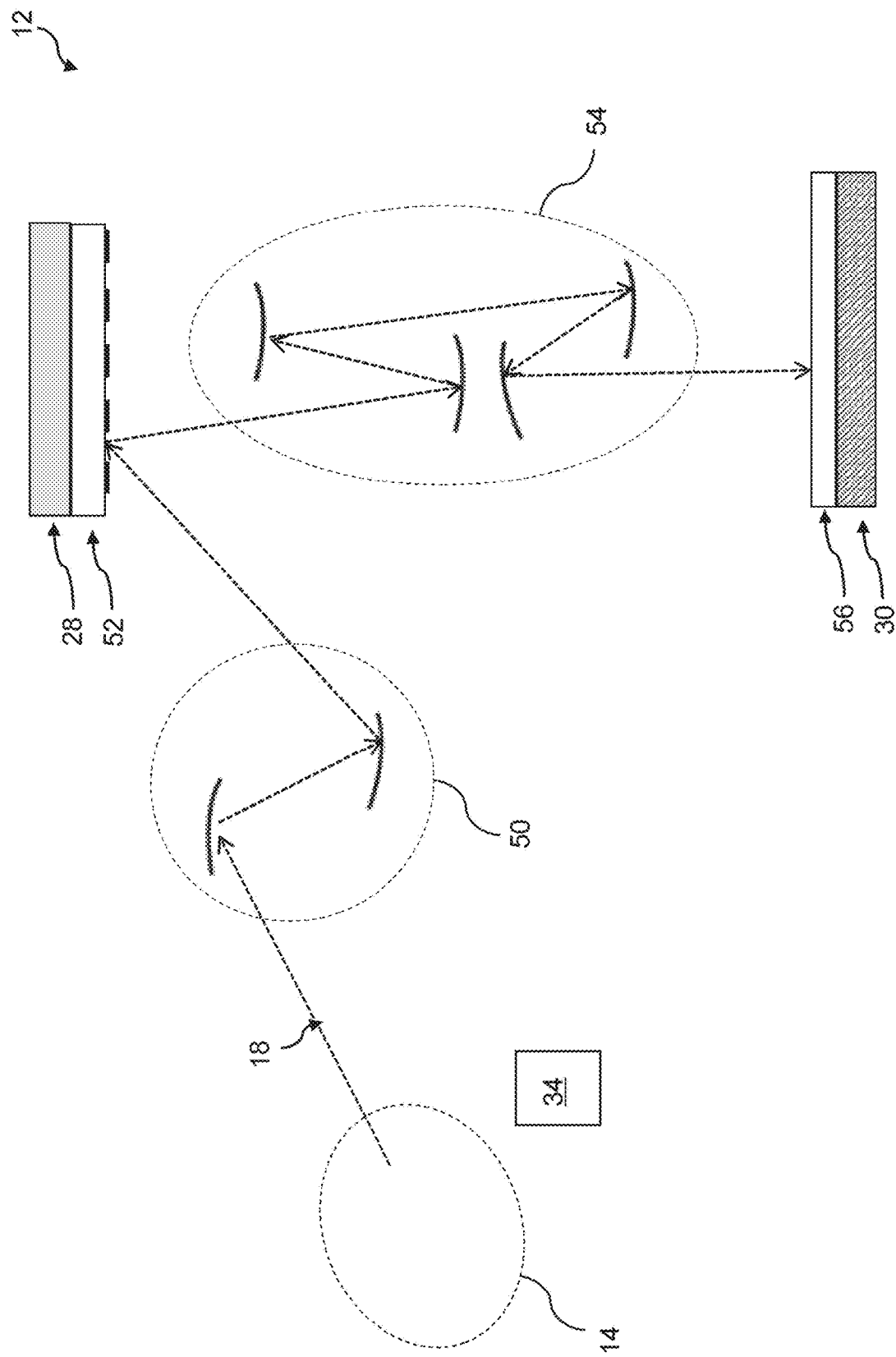
FIG. 2 is a schematic view of an EUV lithography apparatus system embedded with a 3D monitor, constructed in accordance with some embodiments.

FIG. 2 is a schematic view of various modules of the lithography system 10, in part, constructed in accordance with some embodiments. Particularly, FIG. 2 illustrates the EUV lithography apparatus 12 and the monitor module 34. Particularly, the monitor module 34 of the EUV control system 32 is embedded in and integrated with the EUV lithography apparatus 12.

The EUV lithography apparatus 12 is further described with reference to FIG. 2. In the present embodiment, the EUV lithography apparatus 12 is an EUV lithography tool designed to expose a resist layer by EUV radiation. The resist layer is a suitable material sensitive to the EUV radiation. The lithography apparatus 12 employs a radiation source 14 to generate EUV radiation 18, such as EUV light having a wavelength ranging between about 1 nm and about 100 nm. In the depicted embodiment, the radiation source 14 generates an EUV light with a wavelength centered at about 13.5 nm. In furtherance of the embodiment, the central wavelength is at 13.5 nm with 1% full-width half-maximum (FWHM) bandwidth. Accordingly, the radiation source 14 is also referred to as EUV radiation source 14. In the present embodiment, the EUV radiation source 14 utilizes a mechanism of laser-produced plasma (LPP) to generate the EUV radiation 18. Particularly, the radiation source 14 includes a laser source 20, an LPP module 22 and an EUV module 24 as described above in FIG. 1. Particularly, the laser source 20 includes one or more high power $CO_2$ laser system.

The EUV lithography apparatus 12 also employs an illuminator 50. In various embodiments, the illuminator 50 includes various refractive optic components, such as a single lens or a lens system having multiple lenses (zone plates) or alternatively reflective optics (for EUV lithography system), such as a single mirror or a mirror system having multiple mirrors in order to direct light from the radiation source 14 onto a mask stage 28. In the present embodiment where the radiation source 14 generates light in the EUV wavelength range, reflective optics is employed.

The EUV lithography apparatus 12 includes the mask stage 28 configured to secure a mask 52. In some embodiments, the mask stage 28 includes an electrostatic chuck (e-chuck) to secure the mask 52. This is because that gas molecules absorb EUV light and the EUV exposure chamber 16 is maintained in a vacuum environment to avoid EUV intensity loss. In the disclosure, the terms of mask, photomask, and reticle are used to refer to the same item. In the present embodiment, the EUV lithography apparatus 12 is an EUV lithography system, and the mask 52 is a reflective mask. One exemplary structure of the mask 52 is provided for illustration. The mask 52 includes a substrate with a suitable material, such as a low thermal expansion material (LTEM) or fused quartz. In various examples, the LTEM includes $TiO_2$ doped $SiO_2$, or other suitable materials with low thermal expansion. The mask 52 includes a reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask 52 may further include a capping layer, such as ruthenium (Ru), disposed on the ML to protect the ML from oxidation. The mask 52 further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The EUV lithography apparatus 12 also includes a projection optics module (or projection optics box (POB) 54 for imaging the pattern of the mask 52 on to a semiconductor substrate 56 secured on a substrate stage 30 of the EUV lithography apparatus 12. In the present embodiment, the POB 54 has reflective optics for projecting the EUV light. The EUV light, which carries the image of the pattern defined on the mask 52, is directed from the mask 52 and is collected by the POB 54. The illuminator 50 and the POB 54 are collectively referred to an optical module of the EUV lithography apparatus 12.

The EUV lithography apparatus 12 also includes the substrate stage (or wafer stage) 30 to secure the semiconductor substrate 56. In the present embodiment, the semiconductor substrate 56 is a semiconductor wafer, such as a silicon wafer or other type of wafer to be patterned. The semiconductor substrate 56 is coated with the resist layer sensitive to the radiation beam, such as EUV light in the present embodiment. Various components including those described above are integrated together and are operable to perform EUV lithography exposure processes.

In some embodiments, the 3DDM 34 or portions thereof is embedded in and integrated with the EUV lithography apparatus 12 with configuration and mechanism to monitor various parameters of the radiation source 14. In various embodiments, the 3DDM 34 includes a laser monitor 34A, a plasma monitor 34B, an EUV monitor 34C, other suitable monitors or a combination thereof.

In some embodiments, the monitor module 34 includes the laser monitor 34A configured to monitor laser beam, such as laser beam (spatial) profile and the laser beam profile variation over time.

In some embodiments, the monitor module 34 includes the plasma monitor 34B configured to monitor plasma, such as plasma spatial distribution and the variation of the plasma distribution over time.

In some embodiments, the monitor module 34 includes the EUV monitor 34C configured to monitor EUV radiation, such as EUV radiation (spatial) profile and the variation of the EUV radiation profile over time.

In some embodiments, the plasma monitor 34B is designed with a mechanism to, additionally or alternatively, monitor plasma stability of the plasma. The plasma condition of the radiation source 14 varies over time. For example, a target material is used to generate plasma and the condition of the target material changes over time, such as droplet size, the ionized rate from the target material (that will be described later) changes, and the plasma concentration changes accordingly. The variation of plasma condition also causes the variation of the EUV intensity in the lithography exposing process. In some examples, monitoring of the plasma condition is a separate monitor dedicated to monitor the plasma stability.

In some examples, the monitor module 34 includes a utilization monitor with a mechanism to monitor the utilization of the target material droplets in the dose margin. The utilization monitor tracks the historic data of the utilization of the target material droplets for the semiconductor wafers previously processed in the EUV lithography apparatus 12. Alternatively, the utilization monitor is integrated in the plasma monitor 34B to monitor various parameters associated with the plasma. The dose margin and other terms will be further described at later stage.

In some other embodiments, the function of the plasma monitor 34B may be implemented by the EUV monitor 34C. For example, the dose error is related to the plasma instability, through monitoring the EUV energy by the EUV monitor 34C, the dose error is extracted from the monitored EUV energy. The EUV lithography apparatus 12 may further include other modules or be integrated with (or be coupled with) other modules.

In some embodiments, the EUV lithography apparatus 12 includes a gas supply module designed to provide hydrogen gas to the radiation source 14, which effectively protects radiation source 14 (such as the collector) from the contaminations. In other embodiments, the EUV lithography apparatus 12 includes magnet configured to guide the plasma by the corresponding magnetic field.

Figure 3:
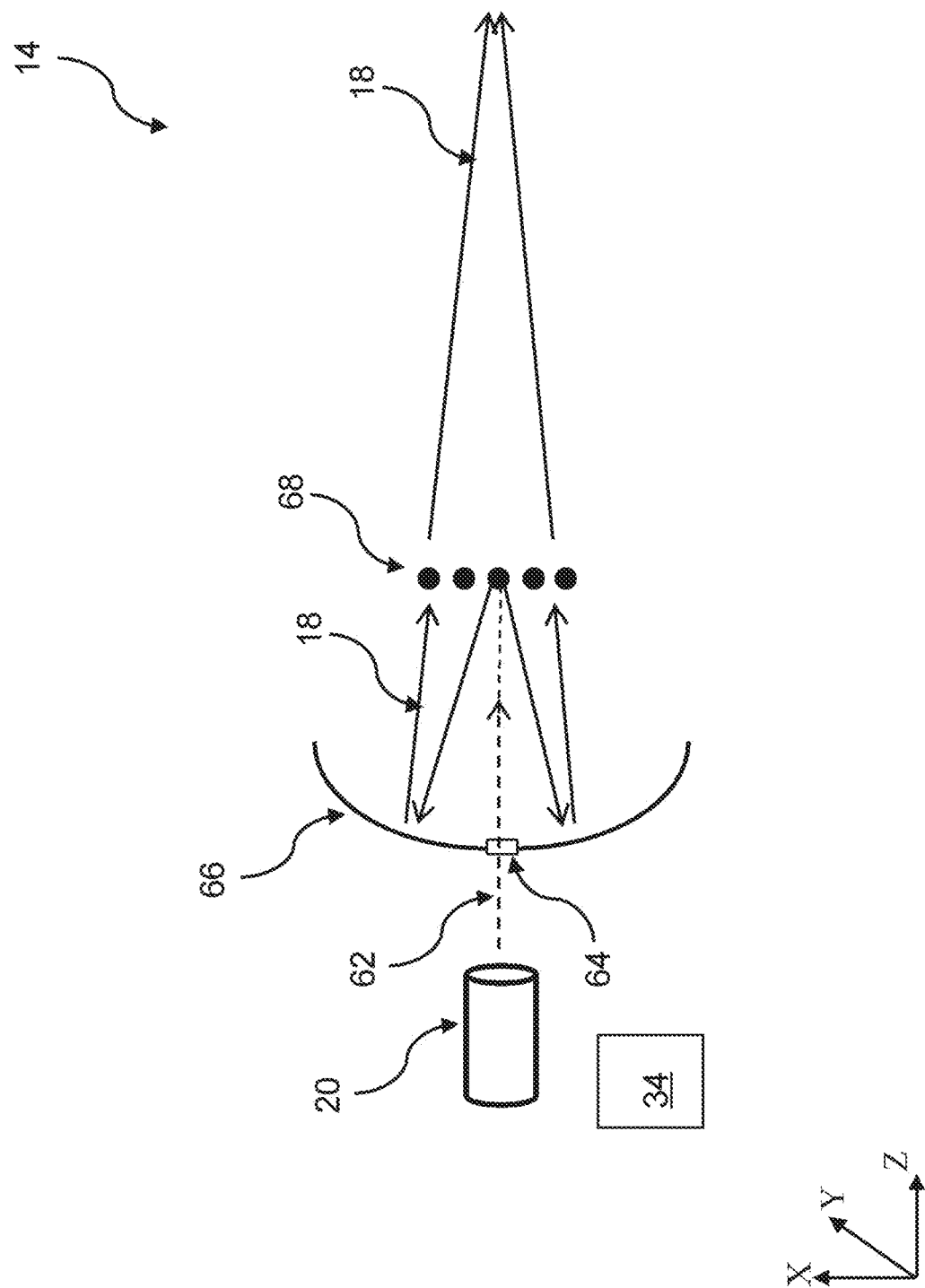
FIG. 3 is a diagrammatic view of the EUV radiation source in the EUV lithography system of FIG. 1, constructed in accordance with some embodiments.

Particularly, the radiation source 14 is further illustrated in FIG. 3 in a diagrammatical view, constructed in accordance with some embodiments. The radiation source 14 employs a laser produced plasma (LPP) mechanism to generate plasma and further generate EUV light from the plasma. The radiation source 14 includes one or more laser 20, such as pulse carbon dioxide ($CO_2$) laser to generate a laser beam 62. In one embodiment for illustration, the laser source 20 includes two laser devices, one to generate pre-pulse hitting on a target material 68, and another to generate main-pulse hitting on the target material 68. The laser 20 may further includes one or more laser amplifier to further amplify the power of the laser beam. In the disclosed embodiment, two laser devices each may include a laser amplifier or alternatively share a laser power. The laser beam 62 is directed through an output window 64 integrated with a collector (also referred to as LPP collector or EUV collector) 66. The output window 64 adopts a suitable material substantially transparent to the laser beam. The collector 66 is designed with proper coating materials and shape, functioning as a mirror for EUV collection, reflection and focus. In some embodiments, the collector 66 is designed to have an ellipsoidal geometry with dual focuses, such as primary focus and intermediate focus. In some embodiments, the coating material of the collector 66 is similar to the reflective multilayer of the EUV mask 52. In some examples, the coating material of the collector 66 includes a ML (such as a plurality of Mo/Si film pairs) and may further include a capping layer (such as Ru) coated on the ML to substantially reflect the EUV light. In some embodiments, the collector 66 may further include a grating structure designed to effectively scatter the laser beam directed onto the collector 66. For example, a silicon nitride layer is coated on the collector 66 and is patterned to have a grating pattern.

The laser beam 62 is directed to heat a target material 68, thereby generating high-temperature plasma, which further produces EUV radiation (or EUV light) 18. In the present embodiment, the target material 68 is Tin (Sn). The target material 68 is delivered in droplets. Those target material droplets (such as Tin droplets) are also simply referred to as droplets. The EUV radiation 18 is collected by the collector 66. The collector 66 further reflects and focuses the EUV radiation for the lithography exposing processes.

The radiation source 14 is configured in an enclosed space (referred to as a source vessel). The source vessel is maintained in a vacuum environment since the air absorbs the EUV radiation. In some embodiments, the source vessel is further provided with hydrogen for protecting the source vessel from contaminations. In some embodiments, the 3DDM 34 is embedded in the radiation source and is configured to monitor various parameters of the radiation source.

Figure 4:
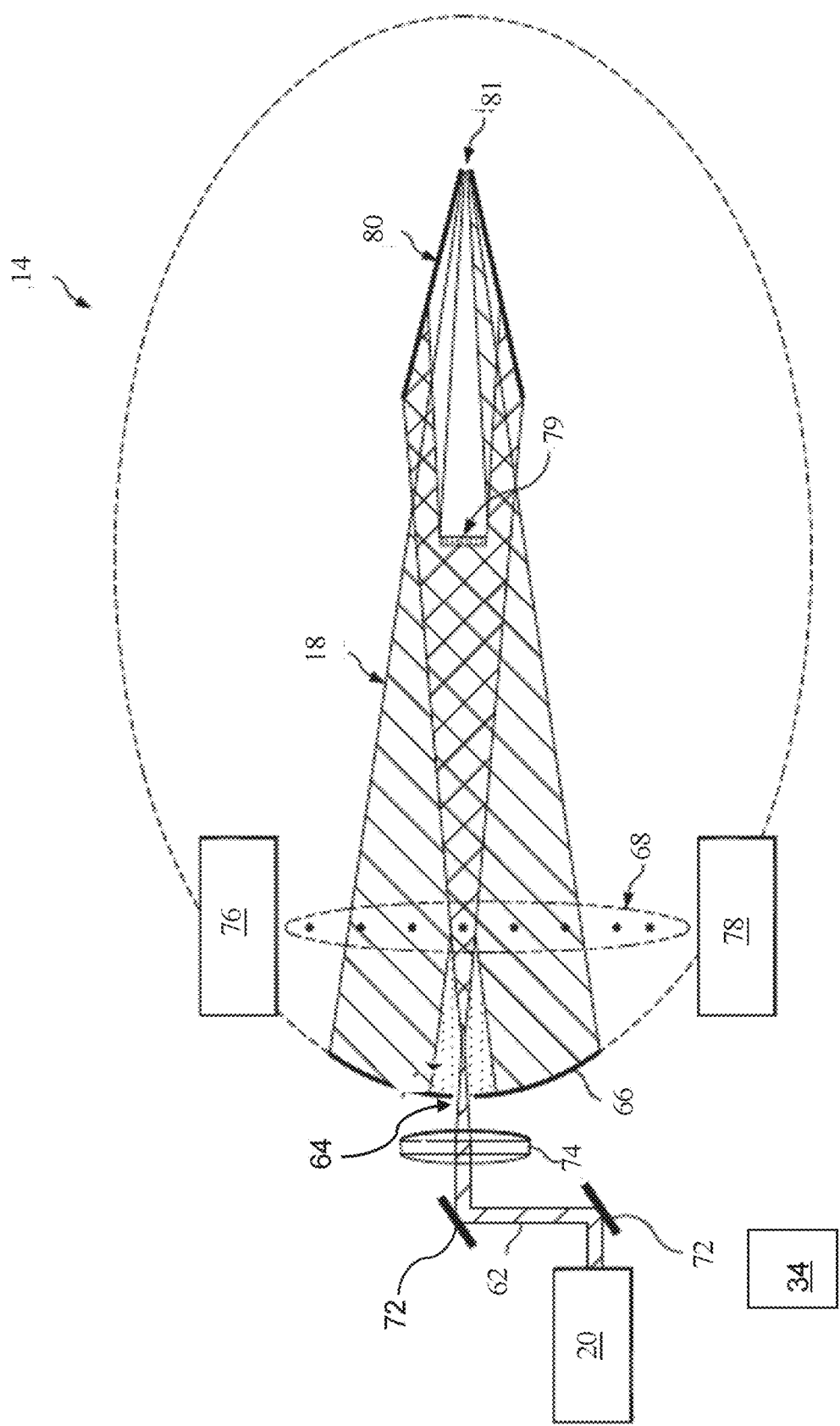
FIG. 4 is a diagrammatic view of the EUV radiation source in the EUV lithography system of FIG. 1, constructed in accordance with some embodiments.

The radiation source 14 may further include more other components integrated together, such as those illustrated in FIG. 4. FIG. 4 is a diagrammatical view of the radiation source 14, constructed in accordance with some embodiments. The radiation source 14 employs a LPP mechanism. The radiation source 14 includes a laser 20, such as pulse $CO_2$ laser to generate laser beam 62. The laser beam 62 is directed by a beam delivery system 72, such as one or more mirrors configured, to a focus lens 74 to focus the laser beam 62. The laser beam 62 is further projected through the output window 64 integrated with a collector 66. The laser beam 62 is focused to the target material 68 (such as Tin droplets 68) in the primary focus of the collector 66, thereby generating high-temperature plasma. The Tin droplets 68 are generated by a Tin droplet generator 76. A Tin catcher 78 is further configured to catch the Tin droplets. Such generated high-temperature plasma further produces EUV radiation 18, which is collected by the collector 66. The collector 66 further reflects and focuses the EUV radiation to an intermediate focus and is further directed for EUV exposure processes.

The pulses of the laser 20 and the droplet generating rate of the Tin droplet generator 76 are controlled to be synchronized such that the Tin droplets 68 receive peak powers consistently from the laser pulses of the laser 20. In some examples, the tin droplet generation frequency ranges from 20 kHz to 100 kHz. For example, the laser 20 includes a laser circuit designed to control the generation of the laser pulses. The laser circuit and Tin droplet generator 76 are coupled to synchronize the generation of the laser pulses and the generations of the Tin droplets 68.

In some embodiments, the radiation source 14 further includes a central obscuration 79 designed and configured to obscure the laser beam 62. The radiation source 14 may further include an intermediate focus (IF)-cap module 80, such as an IF-cap quick-connect module configured to direct the EUV radiation 18 toward the intermediate focus 81 with enhanced conversion gain. The IF-cap module 80 may additionally function to obscure the laser beam 62 for improved performance.

The radiation source 14 may be further integrated with or coupled with other units/modules. For example, a gas supply module is coupled with the radiation source 14, thereby providing hydrogen gas for various protection functions, which include effectively protecting the collector 66 from the contaminations by Tin particles (Tin debris).

Figure 5:
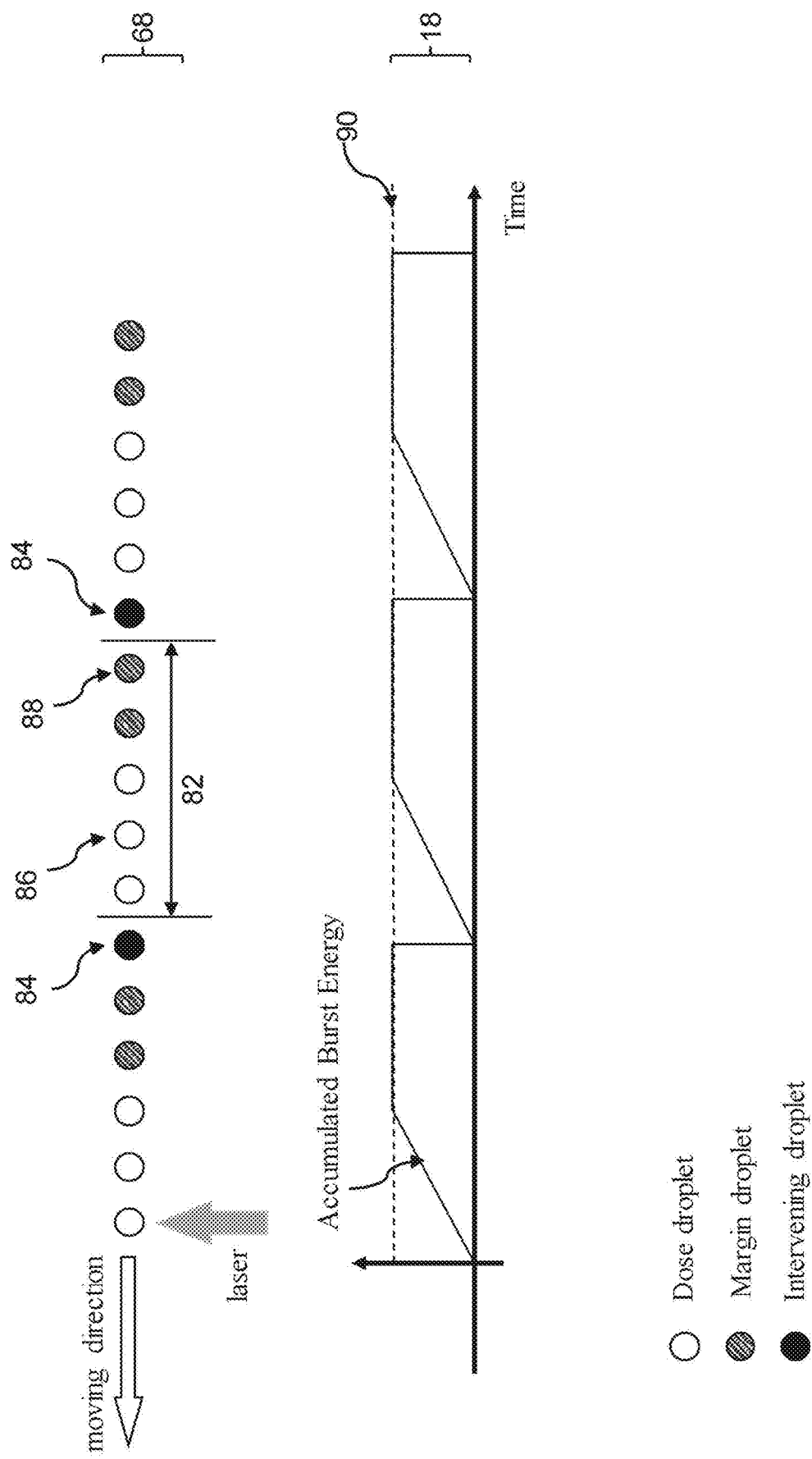
FIG. 5 is a diagrammatic view of the target material droplets used to generate plasma and EUV radiation energy from the plasma in the EUV lithography system of FIG. 1, constructed in accordance with some embodiments.

The target material droplets 68 and EUV radiation 18, and the corresponding mechanism are further illustrated in FIG. 5. The target material droplets 68 are grouped into bursts 82, which are separated by intervening time and intervening droplets 84. In the present embodiments, the intervening droplets 84 will not be excited by the laser beam 62 during the EUV exposure process.

During an EUV exposure process, a series of bursts 82 are provided in the radiation source 14. Each burst 82 includes a plurality of target material droplets 68 and is configured to provide a certain EUV energy (referred to as burst target energy or BTE) during the EUV exposure process. When a semiconductor substrate 56 is exposed using the EUV energy by the lithography system 10, the exposure dosage can be reached when each burst 82 contributes EUV energy to the burst target energy. The target material droplets 68 in each burst are defined to two categories: dose droplets 86 and margin droplets 88. During an EUV exposure process, the dose droplets 86 in each burst 82 are to be excited by the laser to generate plasma and accordingly plasma-generated EUV radiation with EUV energy reaching the burst target energy. The margin droplets 88 in each burst 82 are reserved for dose control and used as a backup to the dose droplets, in order to maintain the EUV energy of the burst to reach the burst target energy. The margin droplets 88 are collectively referred to as dose margin. Due to the instability of the plasma intensity, not all of droplets contribute nominal EUV energy. For example, when the laser generated plasma from one dose droplet has less density, the EUV energy collected from that dose droplet will be less than the normal level. When the EUV energy generated from the dose droplets 86 in the burst 82 cannot reach the burst target energy, the margin droplets 88 or a subset thereof are excited to contribute additional EUV energy such that the total EUV energy from the burst 82 reaches the burst target energy. The number of target material droplets in each burst is Nt. The number of the dose droplets 86 in each burst is designed to be Nd and the number of the margin droplets in each burst is designed to be Nm. There is a relationship among these parameters as Nt=Nd+Nm. Therefore, when the Nt is given, increasing the dose margin will decrease the burst target energy.

Figure 6:
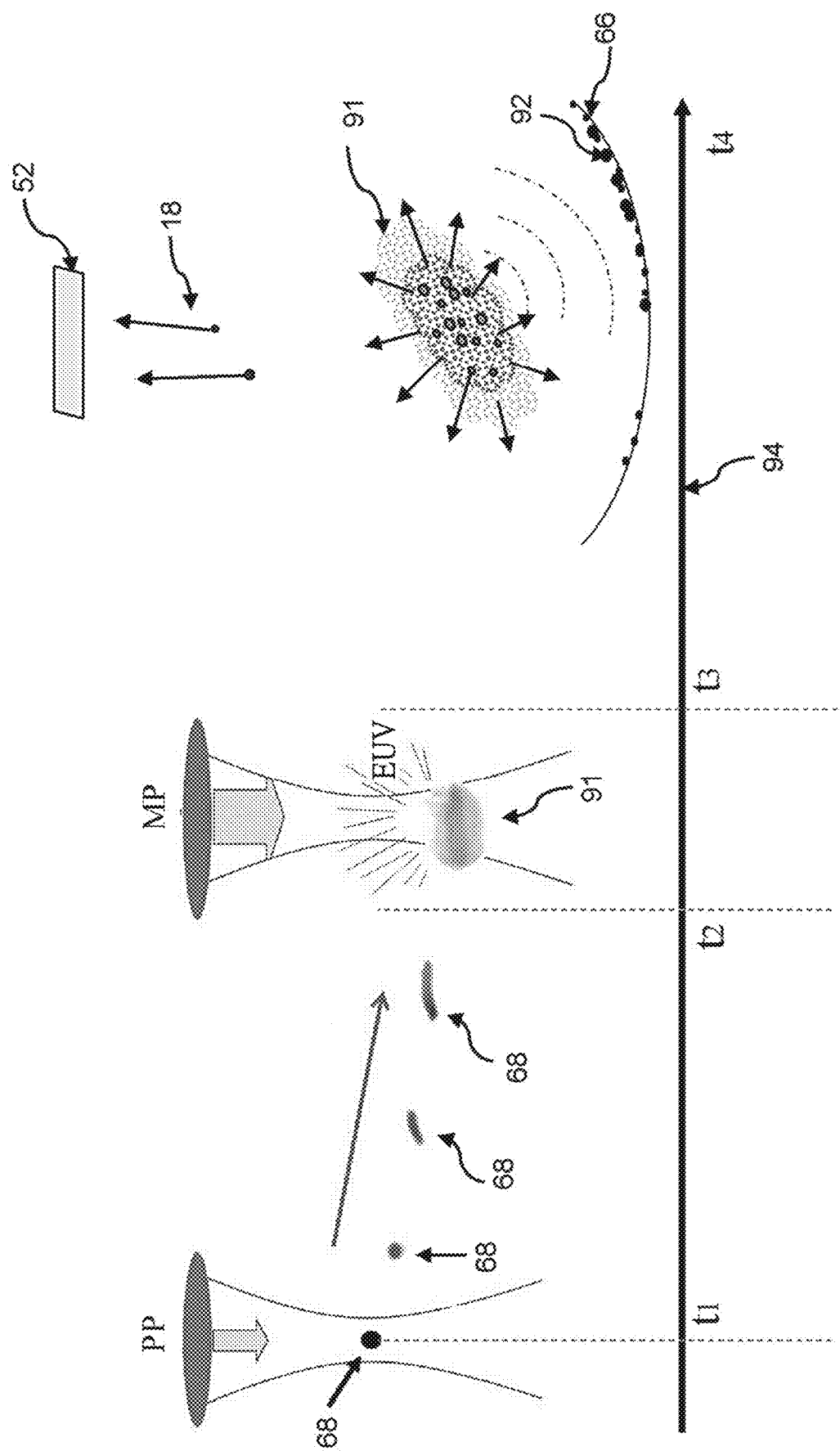
FIG. 6 illustrates a laser-produced plasma (LPP) process, constructed in accordance with some embodiments.

In some embodiments, the laser source 20 may include two or more laser devices configured in a way such that the corresponding lasers beams 62 are sequentially directed toward a target material droplet (e.g., Sn droplet) 68 when the droplet moves from the droplet generator 76 to the droplet catcher 78. Thus, the energies from laser beams of the different laser devices are accumulated to reach a target value so that the laser produced plasma is able to generate desired EUV radiation. This is further described with reference to FIG. 6. FIG. 6 is a schematic view of the droplet 68 interacting with laser beams and a process from laser to plasma and further to EUV radiation, constructed according to some embodiments. The horizontal axis 94 indicates time (not in scale) or progress of EUV generation over time.

As illustrated in FIG. 6, the target material droplet 68, such as a tin droplet in a spherical liquid is hit by a first laser beam (laser pre-pulse or PP), and changes its shape, such as a pancake shape, through its path. Thereafter, a second laser beam (laser main-pulse or MP) hit the target material droplet 68 and turns it into plasma 91 (such as Tin plasma or Sn plasma), which further generates EUV radiation 18. Meanwhile, debris 92 are also generated from the plasma in various forms, such as Sn particles, and are further deposited on the surface of EUV collector 66, causing contaminations that will reduce the reflection efficiency of the EUV collector 66, introduce more equipment downtime of the lithography system 10, and increase the fabrication cost. The above process of energy transformation includes a transformation from laser energy to plasma energy, and a transformation from plasma energy to EUV energy. Between PP and MP, as indicating between t1 and t2 in FIG. 6, the target material droplet 68 upon the laser pre-pulse is hit and is changed its physical state, such as its shape being changed and fragmented, and Sn ions being generated. As being indicated in a region between t2 and t3 in FIG. 6, the target material droplet 68 is hit by the laser main-pulse and is changed its physical state, such as being vaporized and ionized, leading to a state of plasma 91. After MP, as being indicated in a region between t3 and t4 in FIG. 6, the plasma 91 after the laser main-pulse includes portions with enough EUV radiation 18 and accompanying debris 92, being deposited on the surface of the EUV collector 66. The EUV radiation 18 is directed to the photomask 52 for lithography process.

Figure 7:
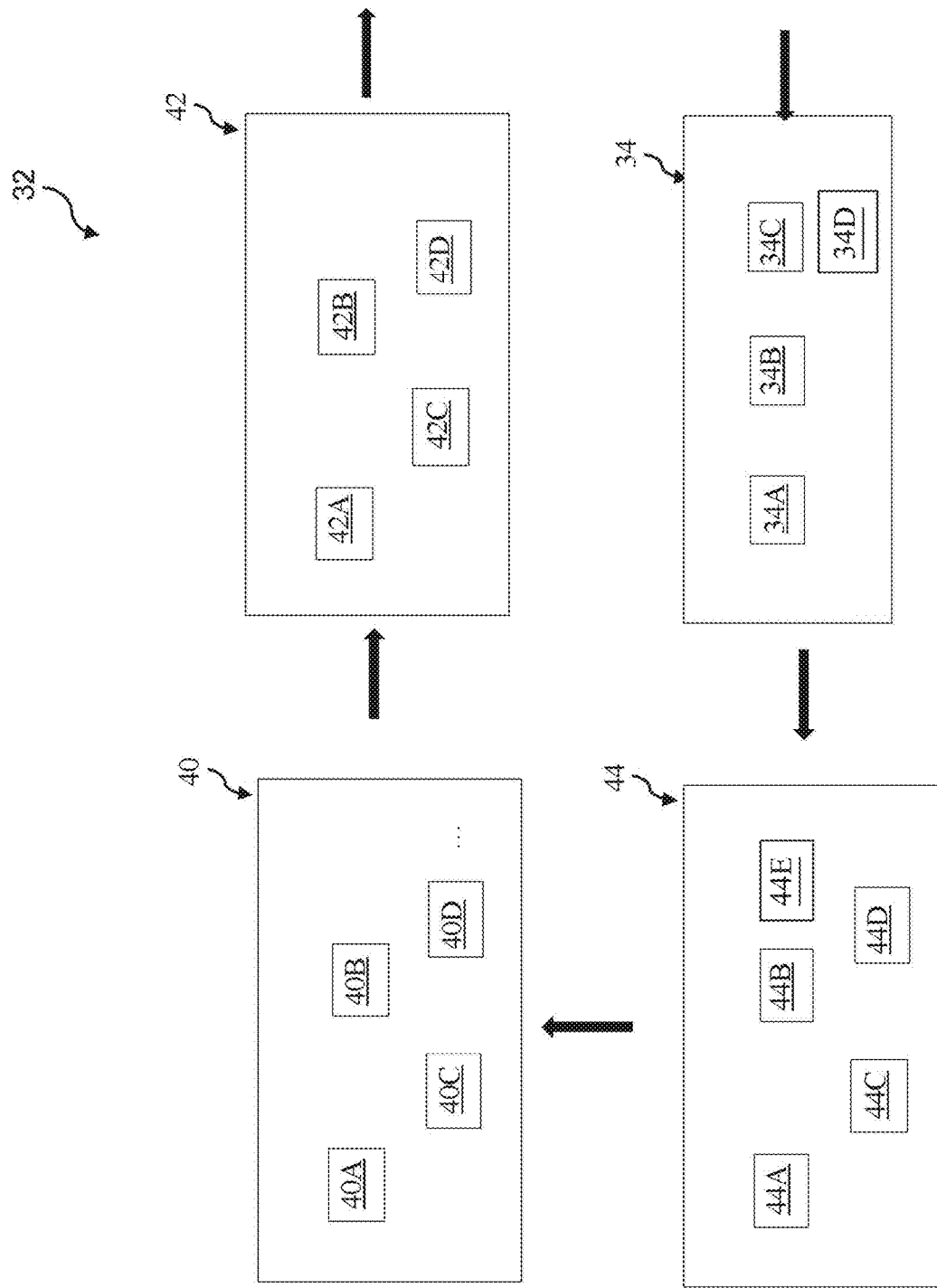
FIG. 7 is a block diagram of an EUV control system, constructed in accordance with some embodiments.

FIG. 7 is a block diagram of the EUV control system 32 constructed according to some embodiments. The 3DDM 34 is described in FIG. 1. For example, the 3DDM 34 includes laser monitor 34A, the plasma monitor 34B, the EUV monitor 34C, and other suitable monitors designed for monitoring corresponding signal of the radiation source 14 and collecting the data thereof. It is not repeated herein for simplicity.

In some embodiments, the 3DDM 34 may further includes a contamination monitor 34D designed with a mechanism to detect the contamination from the target material, such as Sn particles when the plasma is generated by the laser. Those Sn particles may be generated when the plasma is generated by the laser beam and may be deposited on the surfaces of the EUV collector 66, causing contamination and degrading the EUV reflectivity of the EUV collector 66. In some embodiments, the contamination monitor 34D includes one or more photodiodes sensible to the laser beam from the laser source 20 and configured to receive the laser beam. Especially, the laser monitor 34A is able to collect 3D data of the laser beam. For example, the laser monitor 34A includes a plurality of photodiodes configured in an array with a configuration such that laser beam from the laser source 20 can be effectively caught and collected. In other embodiments, the laser monitor 34A includes other suitable detectors (sensible to the laser beam from the laser source 20), such as photomultipliers, opto-isolators, integrated optical circuit (IOC) elements, photo-resistors, photoconductive camera tubes, charge-coupled imaging devices, injection laser diodes, quantum cascade lasers, photo-emissive camera tube, or a combination thereof.

The plasma monitor 34B includes any suitable technology sensible to the plasma generated by the laser beam of the laser source 20 through the LPP module 22. In some embodiments, the plasma monitor 34B includes one or more Faraday rings sensible to the plasma (such as plasma density) generated by laser beam and configured to effectively monitor the plasma. Especially, the plasma monitor 34B is able to collect 3D data of the plasma, such as plasma density distribution. For example, the plasma monitor 34B includes a plurality of Faraday rings configured in an array with a configuration such that plasma generated from the LPP module 22 can be effectively collected. In other embodiments, the plasma monitor 34B includes other suitable detectors (sensible to the plasma density), such as light scattering detector, electron multiplier, or a combination thereof.

The EUV monitor 34C includes any suitable technology sensible to the EUV radiation 18 generated from the plasma. In some embodiments, the EUV monitor 34C includes one or more photodiodes sensible to the EUV radiation 18 and configured to receive the EUV radiation 18. The mechanism of the sensing unit of the EUV monitor 34C may be similar to that of the sensing unit of the laser monitor 34A since both sense photons but photons in different spectral ranges. In some examples, the EUV monitor 34C includes a plurality of photodiodes configured in an array with a configuration such that EUV radiation 18 from the plasma (e.g., specifically reflected from the EUV collectors) can be effectively collected. In other embodiments, the EUV monitor 34C includes other suitable detectors (sensible to the EUV radiation 18), such as photomultipliers, photoresistors, hybrid pixel detectors, other suitable devices, or a combination thereof.

The EUV control system 32 further includes an analysis module 40, a control module 42, and a database 44. Various parameters of the radiation source 14 are monitored and collected by the 3DDM 34, saved in the database 44, analyzed by the analysis module 40 and feedback to the control module 42 to control the radiation source 14 for enhanced lithography system 10 and improved lithography processes implemented by the lithography system 10.

The database 44 includes a physical structure, such as a memory device with input and output for data transferring in and out. Examples of the memory device includes a non-volatile memory (NVM) device, such as flashing memory device or ferroelectric random-access memory (RAM), a volatile memory, such as static RAM (SRAM) device, other suitable memory device, or a combination thereof. The database 44 includes various portions to store respective data, such as a database unit 44A for laser profile data, a database unit 44B for target contamination data, a database unit 44C for plasma distribution data, a database unit 44D for EUV radiation data, and a database unit 44E for analysis data. The database 44 may further include other suitable database units to various data associated with the radiation source 14 or even the EUV lithography apparatus 12.

The analysis module 40 includes various correlation analysis units 40A that analyze the correlations among various parameters, such as a correlation between the laser beam profile and the plasma distribution, a correlation between the plasma distribution and the EUV radiation energy, a correlation between the laser beam profile and the target material debris, a correlation between the laser beam profile and the EUV energy, and other correlations.

Figure 8:
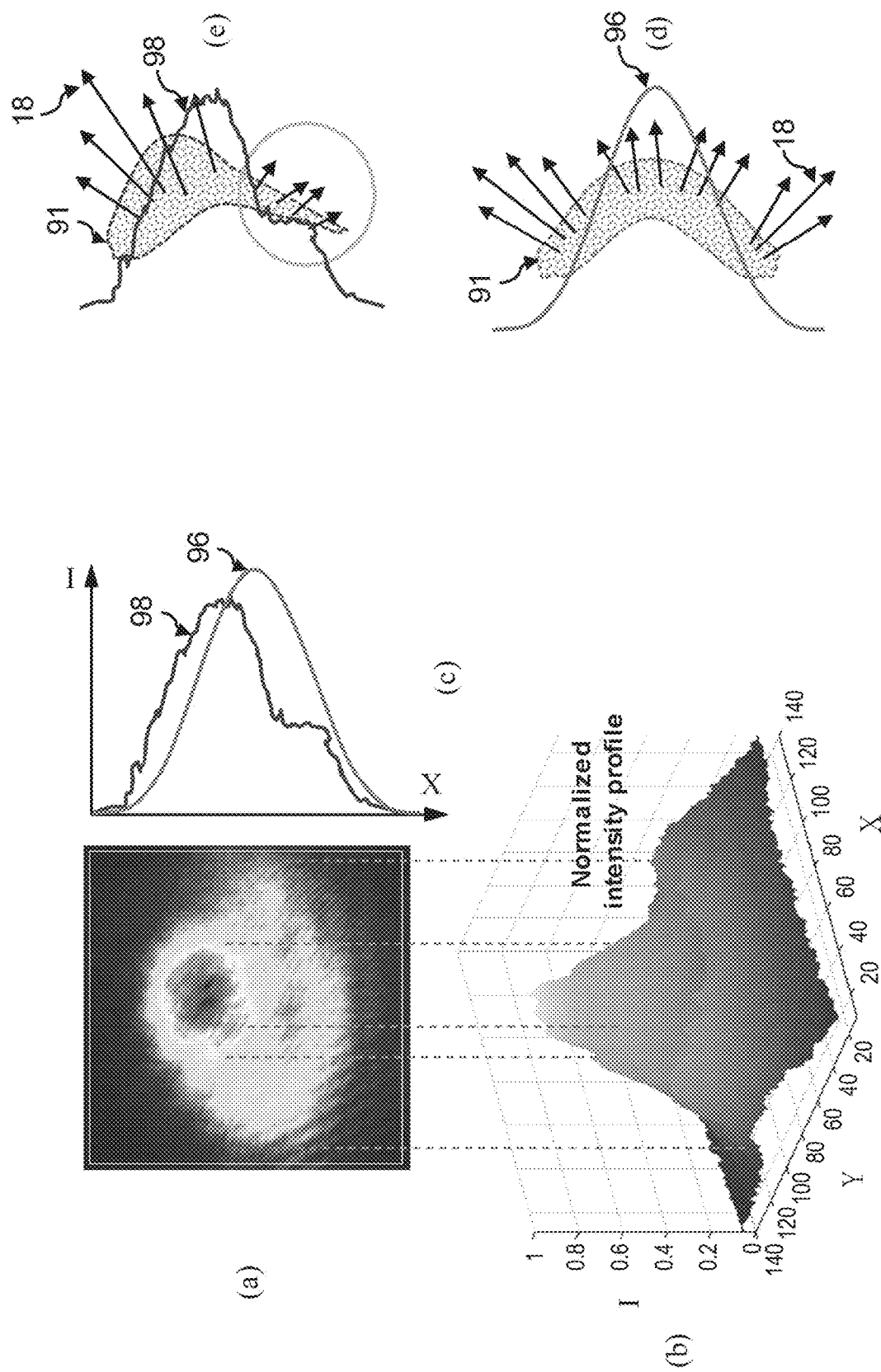
FIG. 8 is a diagrammatic view of a correlation analysis implemented by a correlation analysis unit of the EUV control system, constructed in accordance with some embodiments.

One correlation example is illustrated in FIG. 8 and is described in detail below. FIG. 8(a) is a laser beam profile expressed in the intensity (I) of the laser beam vs the XY surface. The XY surface is defined as a surface in FIG. 3. The laser beam is directed along Z direction from the laser source 20 to the target material 68 while X and Y directions are two orthogonal directions defined in Cartesian coordinate system. The XY surface is defined as a plane surface intersected with Z axis at the location of the target material droplets 68. The corresponding profile of the laser beam is also illustrated in FIG. 8(b) in a diagram view. Two axes present X and Y while another axis presents the intensity (I) of the laser beam. The corresponding distribution or profile of the laser beam is further illustrated in FIG. 8(c) in a diagram view. One axis presents X while another axis presents the intensity (I) of the laser beam. Two example profiles 96 and 98 are illustrated in FIG. 8(c). The first profile 96 of the laser beam has a Gaussian distribution and the second profile 98 of the laser beam has an uneven distribution different from the Gaussian distribution. In the disclosed embodiment, the first profile 96 of the laser beam leads to better generated plasma 91 and less debris and further to higher EUV radiation 18 with greater conversion efficiency (CE); and the second profile 98 of the laser beam leads to weakly generated plasma 91 and more debris, and further to degraded EUV radiation 18 with lower CE. In this example, the laser beam profile is correlated to the plasma profile, the debris and the EUV radiation energy. Such correlation provides information and indication how to tune (such as laser beam profile) for enhanced EUV radiation and less debris.

The analysis module 40 also includes various tool matching units 40B that collect and analyze various parameters, such as the laser beam profile, the plasma distribution, the EUV radiation energy, and debris counting of various lithography systems so to extract useful information, which is feedback for tuning and controlling a lithography system for enhanced EUV radiation and reduced debris.

Figure 9:
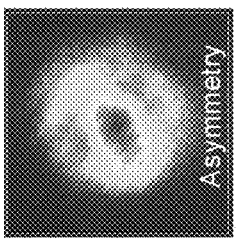
FIG. 9 is a diagrammatic view of a machine matching analysis implemented by a tool matching unit of the EUV control system, constructed in accordance with some embodiments.

One example is illustrated in FIG. 9 and is described in detail below. Data are collected from various lithography tools and compared in terms of the laser beam and plasma distribution. FIG. 9 illustrates the laser beam profile for various lithography systems, such as tool A through tool E. Especially, the laser beam profile for each tool is collected from three different stages: pre-pulse laser beam at the target material 68; main pulse laser beam after the laser amplifier; and main pulse laser beam at the target material 68. Various beam profiles from respective lithography systems and respective stages are illustrated in FIG. 9. Each of them may be different from each other, such as circular, eccentric, peanut-like, asymmetric profile, and so on. Note those are only for illustration purpose. Corresponding plasma distributions are further collected from those lithography systems. EUV radiation energy and CE may be further collected from those lithography systems. Then those data are analyzed to find relationship between the laser beam profile and plasma distribution, or even relationship between the plasma distribution and EUV radiation. Particularly, the relationship between the laser beam profile and the plasma distribution is further mapped to each of the above three laser beam profiles.

In some embodiments, the above analysis generates following results. Each lithography system has a particular laser beam profile, which leads to different plasma thermodynamics and no-linear effect during the laser-plasma evolution. Greater laser intensity regions provide greater EUV radiation and greater CE. Lower laser intensity regions cause insufficient heating and plasma generation effect, which leads to more debris of the target material (such as Sn). Other analysis includes comparing the similarity of laser beams among different lithography systems; and correlating between the laser beam profile and the EUV radiation energy. Those results can be further used in a feedback loop to control and tune the laser source, including laser realignment, focusing of the laser beam and timing control to synchronize the target material droplet 68 and the pulse of the laser source.

The analysis module 40 also includes various modeling units 40C that build corresponding models (such as laser beam model, plasma model, EUV radiation model, or target material contamination model) from the collected data for further analysis (such as correlation analysis). For examples, the correlation analysis may include two stages. In the first stage, the raw data collected from the 3DDM 34 are first processed to filter out the irrelevant data or noise, generating preprocessed data, also being referred to as model of laser beam, plasma or EUV radiation. In the second stage, the preprocessed data are sent to the correlation units 40A for correlation analysis including correlations among the laser beam profile, the plasma distribution, the EUV radiation energy, and target material debris.

Figure 10:
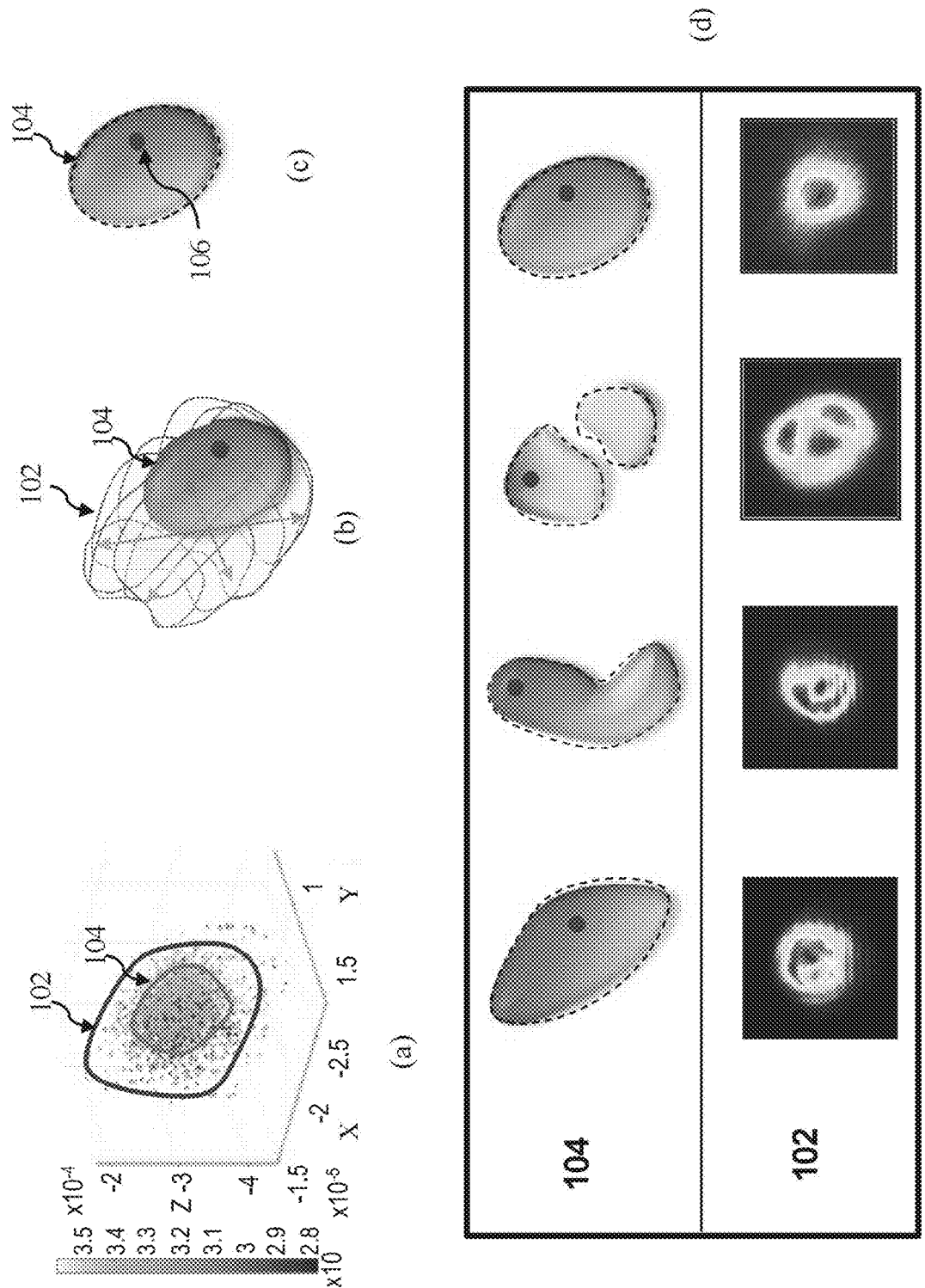
FIG. 10 is a diagrammatic view of a modeling process implemented by a modeling unit of the EUV control system, constructed in accordance with some embodiments.

One example is illustrated in FIG. 10 and is described in detail below. In FIG. 10(a), the laser beam profile is expressed in Cartesian coordinate system around the focused target material droplet 68. The numeral 102 presents the laser beam profile while the numeral 104 presents an effective region. The effective region 104 indicates the region where the plasma generated by the laser beam 62 in this region can effectively and efficiently generate EUV radiation 18 and sustain enough EUV energy in production, such as being greater than a predefined criterion. In one example, this criterion is that EUV radiation intensity is 5 mJ/m$^3$. This is further illustrated in FIG. 10(b). In the disclosed modeling method, only the effective region 104 is relevant and will be further analyzed. In furtherance of embodiments, the space where the EUV energy is distributed is further divided into three-dimension (3D) grids, such as cubic grid in Cartesian coordinate system in 3D. Those grids are individually evaluated using the criterion to determine the effective region. Other regions are removed and discarded, as illustrated in FIG. 10(c). The geometrical center of the effective region 104 is labeled with the numeral 106. FIG. 10(d) provides more examples of the laser beam profile 102 and the corresponding effective region 104. In this case, the target material droplet laser beam should be positioned at the center 106 of the effective region 104 for enhanced generation of the EUV radiation. This can be feedback for controlling and tuning the laser beam 62 and synchronization of the target material droplet 68. FIG. 10 will be further described below with other units of the analysis module 40.

The analysis module 40 also includes one or more machine learning unit 40D that analyze various collected or preprocessed data using one or more machine learning technology, such as artificial neural network. In some embodiments, those data as train data are feed to the machine learning unit 40D using the improved EUV radiation energy as the desired output so that the machine learning unit 40D identify the optimized conditions to generate the increased EUV radiation energy and decreased debris contamination. Those conditions can be feedback to the control module 42 to adjust and tune the corresponding lithography system to the optimized conditions for enhanced lithography processes.

One embodiment of the machine learning process by the machine learning unit 40D is further described with reference to FIG. 10. In this embodiment, the predefined EUV energy criterion is used as the desired output, the laser beam profile and the corresponding EUV radiation energy are used as training data, the machine learning unit 40D could identify the desired position of the target material droplet 68. In one example for illustration, the desired position of the target material droplet 68 is at the location (X=0.34 μm, Y=4.5 μm, and X=−112 μm), which can be provided to the control module 42 for adjustment.

Figure 11:
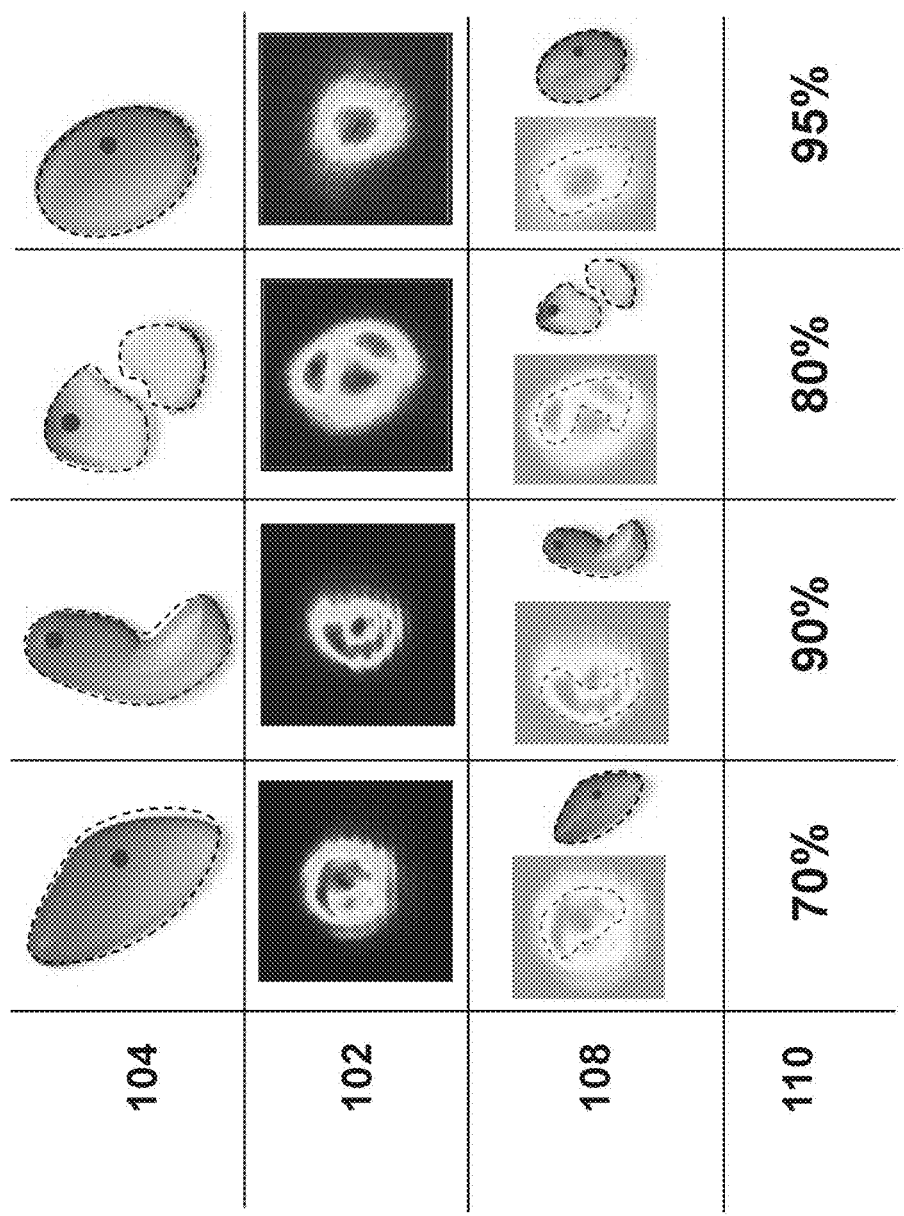
FIG. 11 illustrates a diagrammatic view of a machine learning process implemented by a machine learning unit of the EUV control system, constructed in accordance with some embodiments.

The machine learning process by the machine learning unit 40D is further described with reference to FIG. 11. FIG. 11 includes a table that includes 4 examples in 4 columns. In the table, the second row includes laser beam profiles 102, the first row includes the effective regions 104 of the laser beams, the third row includes the machine learning results. For each example, the effective regions 108 obtained by the machine learning process is provided, which is similar to the effective regions obtained by the modeling method described above. The similarities 110 of both are provided in the fourth row. The results indicate that similarities are high and both methods are effective.

Figure 12:
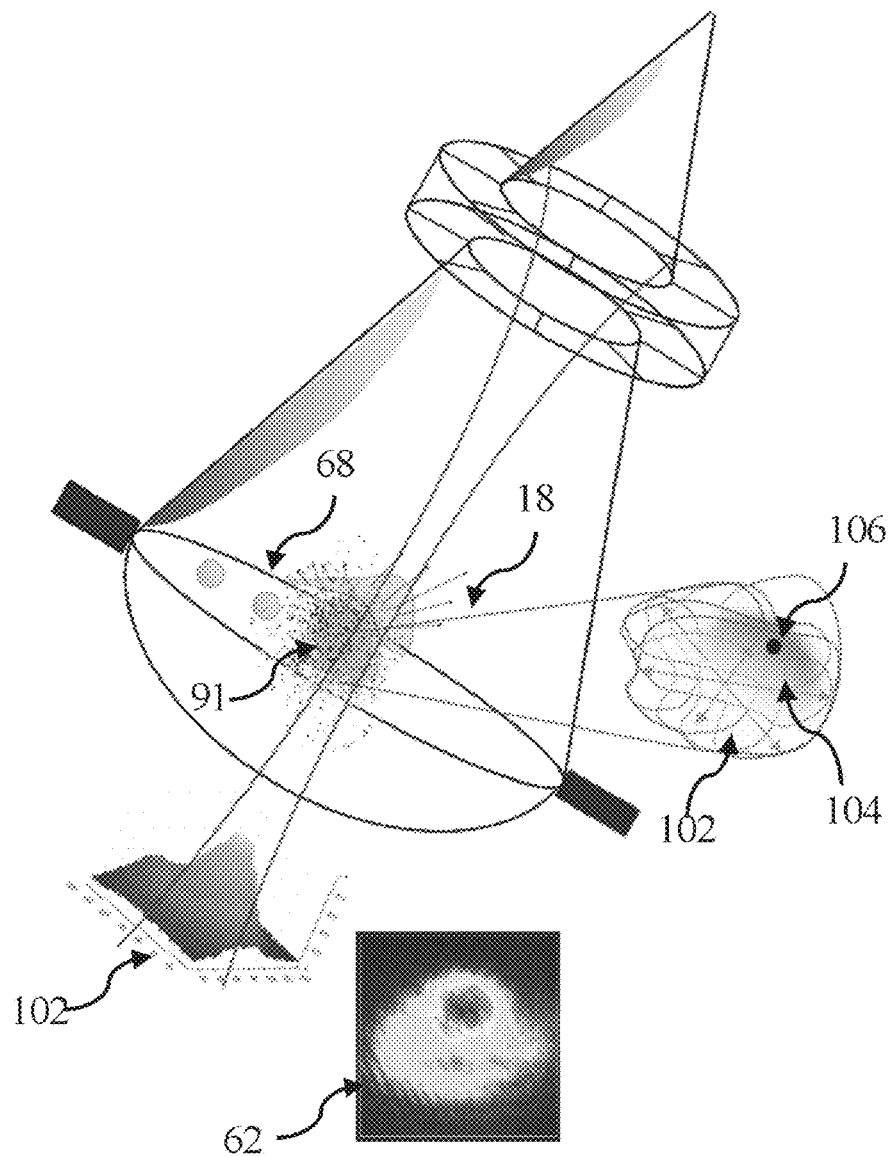
FIG. 12 is a diagrammatic view of a process to collect data, analyze the collected data, extract the information from the analysis and control the lithography system for enhanced lithography processes by the EUV control system, constructed in accordance with some embodiments.

FIG. 12 illustrates a process to collect data, analyze the collected data, extract the information from the analysis and control the lithography system for enhanced lithography processes by utilizing various modules of the EUV control system 32. In some examples, the data are collected by the monitors 34 and the collected data include targeting data (the target material position relative to the focus point of the laser beam) and 3DDM data of laser beam profile, plasma distribution and EUV radiation energy. The analysis is implemented by the analysis module 40 and may include modeling, correlation analysis, tool matching, machine learning, or a combination thereof. In one example, the analysis generates the correlation between the EUV radiation energy and targeting position. The correlation results are further feedback to the control module 42 to tune the laser source 20 (such as laser beam orientation and focus) and the timing of the target material droplet 68 so that the targeting position is tuned to the position with increased or maximized EUV radiation energy. Especially, the effective region 104 is associated with higher vaporization, higher ion energy and higher EUV radiation energy and less debris accumulation while other region is associated with lower vaporization, lower ion energy and lower EUV radiation energy and more debris accumulation. The analysis also includes comparing the similarity between the laser beam profile and the effective region; comparing 3D capture rate between beam profile and effective data region; and building up a time resolved effective model to compare targeting map.

Figure 13:
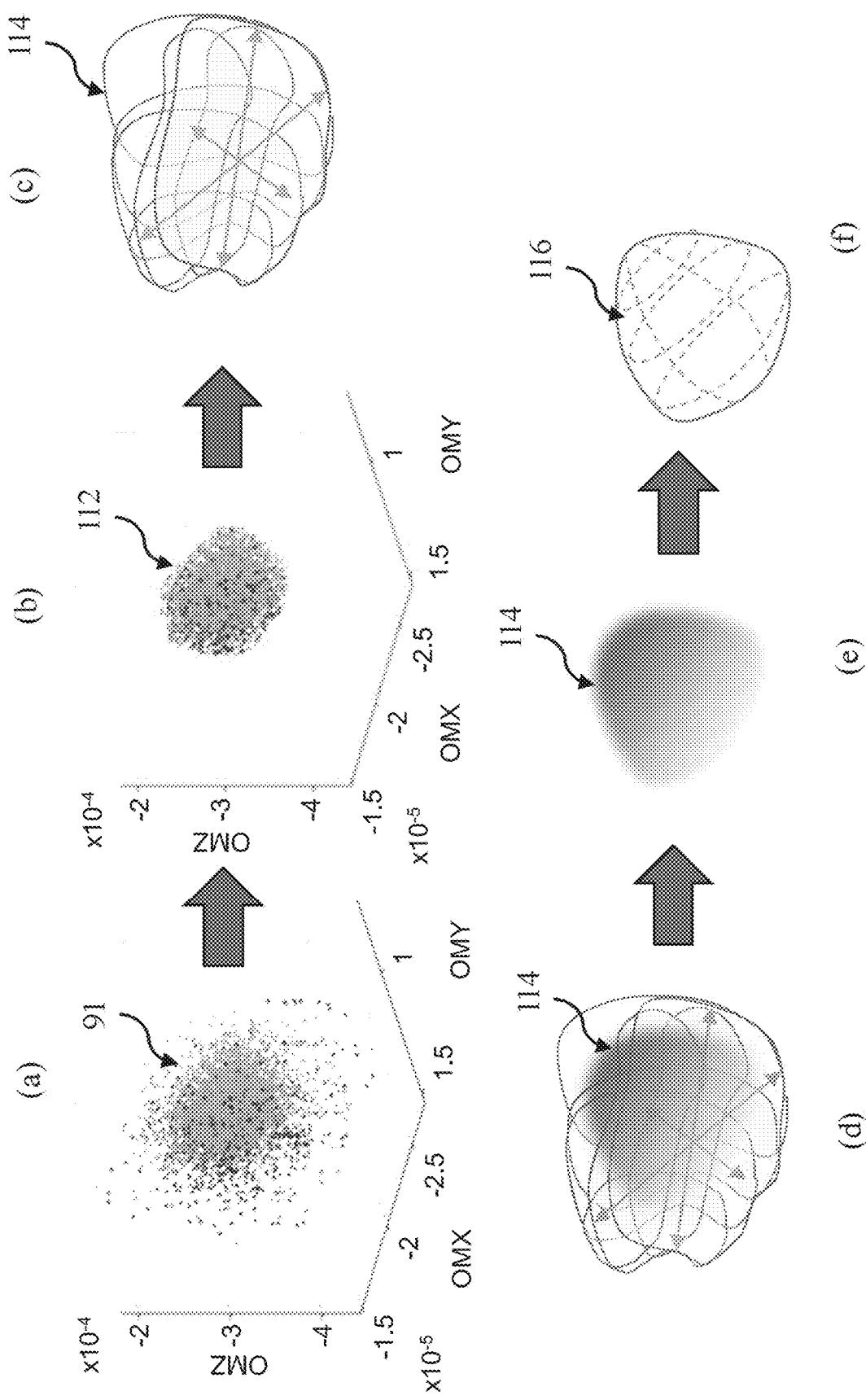
FIG. 13 illustrates a diagrammatic view of a data process that includes collecting data, modeling and analyzing the collected data, constructed in accordance with some embodiments.

FIG. 13 illustrates another data process that includes collecting data, modeling and analyzing the collected data. In FIG. 13(a), the distribution of the plasma 91 is collected in 3D mode. Then a statistical criterion, such as 36, is used to fill out scattering data, resulting in the preprocessed distribution (or preprocessed plasma distribution) 112 as illustrated in FIG. 13(b). The parameter σ is the standard deviation of the normal distribution. Then the data space 114 is extracted from the preprocessed distribution 112, as illustrated in FIG. 13(c). The data space 114 defines the outer contour of the preprocessed distribution. The effective region 116 is determined in the data space 114 using a proper analysis, such as correlation analysis, machine learning, other suitable method or a combination thereof, as illustrated in FIGS. 13(d) and (e). In one example for illustration, the effective region is the plasma region where sufficient EUV radiation energy is generated. Furthermore, the effective region 116 is extracted from the data space 114, as illustrated in FIG. 13(f). The effective region 116 provide information for controlling and tuning the lithography system 10 for enhanced lithography processes. For example, the geometrical center of the effective region 116 is feedback to the control module 42 to adjust alignment of the laser beam 62 and timing of the target material droplet 68 for enhanced EUV radiation.

Referring back to FIG. 7, the control module 42 is further described according to various embodiments. In some embodiments, the control module 42 includes a laser alignment unit 42A, a targeting position control unit 42B, a laser pulse delay adjustment unit 42C, and a vessel control unit 42D. The laser alignment unit 42A includes a mechanism to adjust alignment of the laser beam so that the laser beam profile is tuned accordingly. The mechanism of the laser alignment unit 42A includes stepper motor, piezoelectric material, other suitable mechanism or a combination thereof to adjust the alignment of the laser beam, optics components to fucus the laser beam so that the laser beam profile is optimized for increased EUV radiation.

The targeting position control unit 42B includes a mechanism to adjust the delivery of the target material droplet 68 so that the laser beam is focused on the proper position of the target material droplet 68. The mechanism of the targeting position control unit 42B includes a circuit to fine tune the delivery time.

The laser pulse delay adjustment unit 42C includes a mechanism to adjust timing of the laser pulse so that the laser pulse (pre-pulse or main pulse) is generated in a proper timing so the laser pulse is synchronized with the delivery of the target material droplet 68, therefore pre-pulse laser beam or main-pulse laser beam can strike on the proper position of the target material droplet 68. The mechanism of the laser pulse delay adjustment unit 42C includes a circuit to fine tune the laser device to generate laser pulse in a proper time.

The vessel control unit 42D includes one or more mechanism to adjust various parameters, such as vessel pressure, vessel gas flow rate, and vessel temperature, of the radiation source 14 so the laser beam 62, plasma 91 and EUV radiation 18 are optimized according to the feedback from the data analysis. Those parameters are relevant to the contamination and EUV radiation. For example, the vessel temperature is one parameter to control the evaporation of the target materials, therefore impacting the contamination and EUV radiation energy. In another example, the vessel hydrogen flow rate and pressure are parameters to control the contamination of the target material and the EUV radiation energy. The mechanism of the vessel control unit 42D includes a flow control device to tune the flow rate of the vessel gas, such as hydrogen flow rate, circuit to fine tune the delivery time; a pressure sensor and a flow control device to tune the flow rate of the vessel gas such that the vessel pressure is optimized; and a thermal sensor and a circuit to control the power of the heater so that the vessel temperature is optimized for enhanced EUV radiation.

Figure 14:
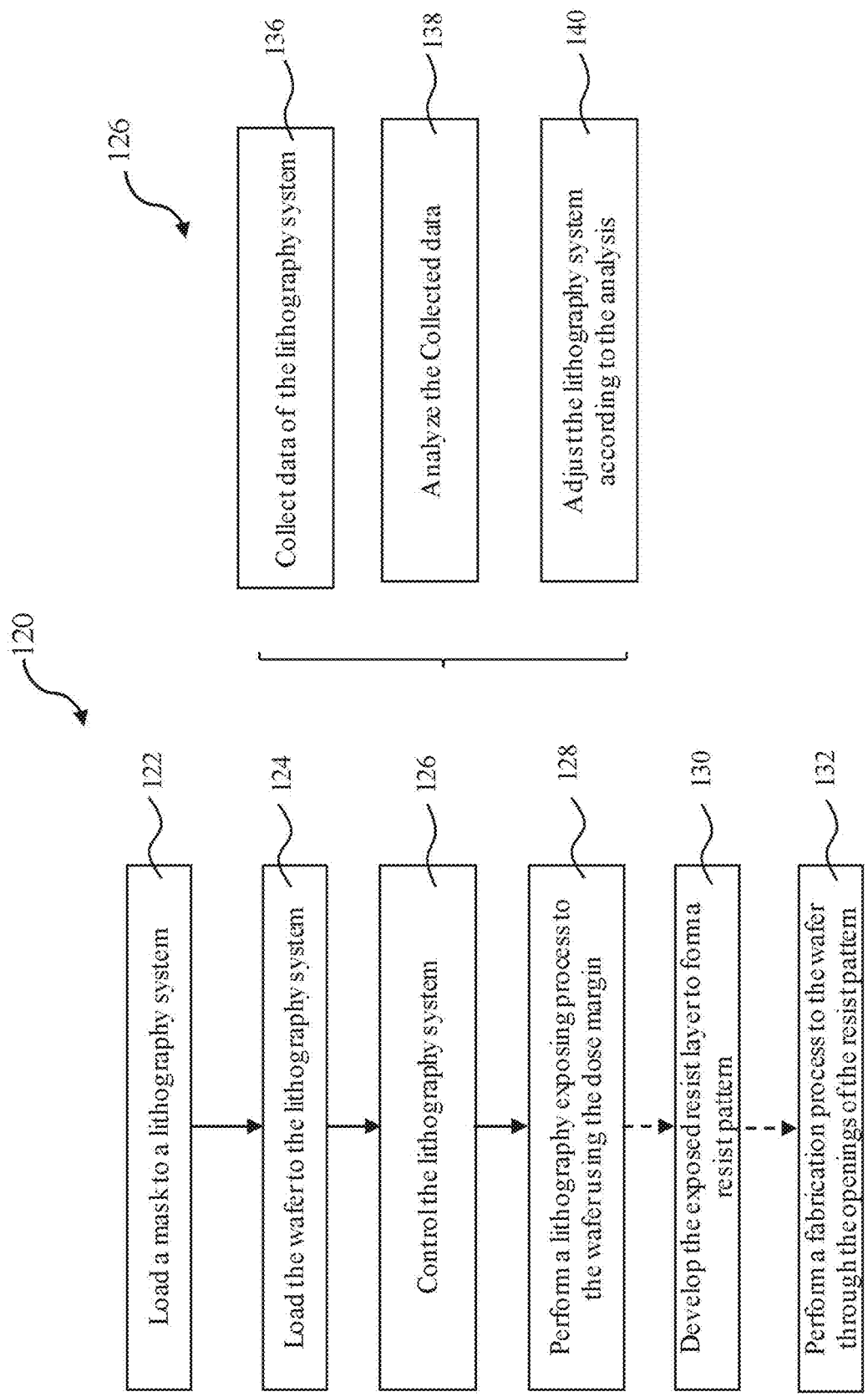
FIG. 14 is a flowchart of a method applied to the EUV lithography system of FIG. 1, constructed in accordance with some embodiments.

FIG. 14 illustrates a flowchart of the method 120 for a EUV lithography process implemented by the lithography system 10, constructed in accordance with some embodiments.

The method 120 includes an operation 122 by loading a EUV photomask 52 to the lithography system 10 that is operable to perform a EUV lithography exposure process. The photomask 52 includes an IC pattern to be transferred to a semiconductor substrate, such as a semiconductor wafer 56. The operation 122 may further include various steps, such as securing the photomask 52 on the mask stage 28 and performing an alignment.

The method 120 includes an operation 124 by loading the wafer 56 to the lithography system 10. The wafer 56 is coated with a photoresist layer. In the present embodiment, the photoresist layer is sensitive to the EUV radiation 18 from the radiation source 14 of the lithography system 10.

The method 120 includes an operation 126 by controlling the lithography system 10, especially adjusting the radiation source 14 for enhanced EUV radiation. The operation 126 further includes multiple steps (or suboperations) to adjust and tune the lithography system 10 for enhanced lithography processes. In the disclosed embodiment, the operation 126 includes a step 136 to collect data of the radiation source 14 by the monitoring module 34; a step 138 to analyze the collected data by the analysis module 40; and a step 140 to adjust the radiation source 14 by the control module 42 according to the analysis results obtained at the step 138.

Particularly, in some embodiments, collecting data of the radiation source 14 by the monitoring module 34 includes collecting data of the laser beam profile by the laser monitor 34A; collecting data of the plasma distribution by the plasma monitor 34B; collecting data of the EUV radiation energy by the EUV monitor 34C; collecting data of Sn contamination by the Sn contamination monitor 34D; or a combination thereof. In some embodiments, analyzing the collected data by the analysis module 40 includes analyzing the collected data by the correlation analysis unit 40A; analyzing the collected data by the tool matching unit 40B; analyzing the collected data by the modeling unit 40C; analyzing the collected data by the machine learning unit 40D; or a combination thereof. Adjusting the radiation source 14 by the control module 42 includes adjusting the laser beam profile by the laser alignment unit 42A; adjusting the delivery of the target material droplet by the targeting position control unit 42B; adjusting the synchronization of the laser pulse (pre-pulse or main-pulse) by the laser pulse delay adjustment unit 42C; adjusting the vessel pressure, the vessel gas flow rate and/or vessel temperature by the vessel control unit 42D; or a combination thereof.

The method 120 includes an operation 128 by performing a lithography exposure process to the wafer 56 in the lithography system 10. In the operation 128, the laser 20 and the tin droplet generator 68 are synchronized (specifically, laser pulses and Tin droplet generation are synchronized) through a suitable mechanism, such as a control circuit with timer to control and synchronize both. The synchronized laser 20 excites the target material droplets 68 and generates plasma, thereby generating the EUV radiation. During the operation 128, the generated EUV radiation is illuminated on the photomask 52 (by the illuminator 50) and is further projected on the resist layer coated on the wafer 56 (by the POB 54), thereby forming a latent image on the resist layer. In the present embodiment, the lithography exposing process is implemented in a scan mode.

Particularly, during the lithography exposure process, the target material droplets 68 are excited by the laser beam 62 to generate plasma 91 and further generate EUV radiation 18. Various steps in the 126 may be implemented with the lithography exposure process at the same time or with time overlapping. For example, collecting data by the monitors 34 at the operation 136 and analyzing the collected data by the analysis module 40 at the operation 138.

The method 120 may include other operations to complete the lithography patterning process. For example, the method 120 may include an operation 130 by developing the exposed photoresist layer to form a photoresist pattern having a plurality of openings defined thereon. In one example, the photoresist layer is positive tone; the exposed portion of the photoresist layer is removed by the developing solution. In another example, the photoresist layer is negative tone; the exposed portion of the photoresist layer remains; and the non-exposed portions are removed by the developing solution.

Particularly, after the lithography exposure process at the operation 128, the wafer 56 is transferred out of the lithography system 10 to a developing unit to perform the operation 130. The method 120 may further include other operations, such as various baking steps. As one example, the method 120 may include a post-exposure baking (PEB) step between the operations 128 and 130.

The method 120 may further include other operations, such as an operation 132 to perform a fabrication process to the wafer 56 through the openings of the photoresist pattern. In one example, the fabrication process includes applying an etch process to the semiconductor substrate 56 or a material layer thereon using the photoresist pattern as an etch mask. In another example, the fabrication process includes performing an ion implantation process to the semiconductor substrate 56 using the photoresist pattern as an implantation mask. After the operation 132, the photoresist layer may be removed by wet stripping or plasma ashing.

The present disclosure provides an EUV lithography system with 3D sensing and tuning modules. The EUV lithography system includes 3D diagnostic module embedded in the radiation source vessel, and analysis and control modules to tune the radiation source according to the analysis of the 3D data of the radiation source. By implementing the disclosed EUV lithography system 10 and the method applied thereto, the EUV lithography system 10 is fine tuned to increase the EUV radiation energy, reduce debris contamination, and enhance the lithography exposure process. The disclosed EUV lithography system 10 includes an EUV lithography tool integrated with an EUV control system 32 that further includes a monitor 34, an analysis module 40, a control module 42 and a database 44. The monitor 34 of the EUV control system 32 is embedded in the radiation source 14 of the EUV lithography apparatus 12. In some examples, the method includes collecting data of the radiation source 14 by the monitor 34, analyzing the collected data by the analysis module 40, and adjusting the radiation source 14 by the control module 42 according to the analysis.

In one example aspect, the present disclosure provides a method for an extreme ultraviolet (EUV) lithography system that includes a radiation source having a laser device configured with a mechanism to generate an EUV radiation. The method includes collecting a laser beam profile of a laser beam from the laser device in a 3-dimensional (3D) mode; collecting an EUV energy distribution of the EUV radiation generated by the laser beam in the 3D mode; performing an analysis to the laser beam profile and the EUV energy distribution, resulting in an analysis data; and adjusting the radiation source according to the analysis data to enhance the EUV radiation.

In another example aspect, the present disclosure provides an extreme ultraviolet (EUV) lithography system. The EUV system includes a radiation source to generate an EUV radiation, wherein the radiation source includes a laser source, a target material droplet generator, and an EUV collector configured in a vessel; a mask stage configured to secure an EUV mask; a wafer stage configured to secure a semiconductor wafer; an optical module designed to direct the EUV radiation from the radiation source to image an IC pattern defined on the EUV mask to the semiconductor wafer in a lithography exposure process; and an EUV control system integrated with the radiation source. The EUV control system includes a 3-dimensional diagnostic module (3DDM) designed to collect data of the radiation source in 3D mode, an analysis module designed to analyze the collected data, and an EUV control module designed to adjust the radiation source. The 3DDM is embedded in the radiation source. The analysis module is coupled with the 3DDM and the EUV control module. The EUV control module is coupled with the analysis module and the radiation source.

In yet another example aspect, the present disclosure provides a method for an extreme ultraviolet (EUV) lithography system that includes a radiation source having a laser device and a laser-produced plasma mechanism to generate an EUV radiation. The method includes collecting 3-dimensional (3D) data of the radiation source, the 3D data including a laser beam profile and an EUV energy of the EUV radiation; performing an analysis to the laser beam profile and the EUV energy, resulting in a correlation data; and adjusting the radiation source according to the correlation data to enhance the EUV radiation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) lithography system, comprising:
   a radiation source; and
   an EUV control system integrated with the radiation source, wherein the EUV control system includes:
    a 3-dimensional diagnostic module (3DDM) designed to collect a laser beam profile of a laser beam from the radiation source in a 3-dimensional (3D) mode,
    an analysis module designed to analyze the laser beam profile,
    a database designed to store the laser beam profile, and
    an EUV control module designed to adjust the radiation source,
    wherein the analysis module is coupled with the database and the EUV control module,
    wherein the database is coupled with the 3DDM and the analysis module, and
    wherein the EUV control module is coupled with the analysis module and the radiation source.

2. The EUV lithography system of claim 1, wherein the 3DDM includes:
    a laser monitor to monitor the laser beam from the radiation source;
    a plasma monitor to monitor a plasma produced by the laser beam; and
    an EUV monitor to monitor an EUV radiation generated from the plasma.

3. The EUV lithography system of claim 2, wherein the analysis module includes:
    a correlation analysis unit to analyze a correlation between the laser beam profile of the laser beam and an EUV radiation energy of the EUV radiation;
    a modeling unit to extract effect data from collected data; and
    a machine learning unit to extract an effective laser beam profile according to associated EUV radiation.

4. The EUV lithography system of claim 1, wherein the 3DDM includes a contamination monitor to monitor a contamination from target material droplets, and
    wherein the target material droplets are generated when a plasma is generated by the laser beam.

5. The EUV lithography system of claim 1, wherein the 3DDM includes a plurality of photodiodes configured in an array configured to collect the laser beam.

6. The EUV lithography system of claim 1, wherein the 3DDM is further designed to collect 3D data of a plasma produced by the laser beam.

7. The EUV lithography system of claim 1, wherein the 3DDM is embedded in the radiation source.

8. An extreme ultraviolet (EUV) lithography system, comprising:
    a radiation source; and
    an EUV control system integrated with the radiation source,
    wherein the EUV control system includes:
        a 3-dimensional diagnostic module (3DDM) designed to collect a 3-dimensional (3D) laser beam profile of a laser beam from the radiation source and 3D data of a plasma produced by the laser beam, and
        an EUV control module coupled with and designed to adjust the radiation source.

9. The EUV lithography system of claim 8, wherein the EUV control system further includes an analysis module designed to analyze the 3D laser beam profile,
    wherein the analysis module is coupled with the EUV control module, and
    wherein the EUV control module is designed to adjust the radiation source based on results from the analysis module.

10. The EUV lithography system of claim 8, wherein the 3DDM is embedded in the radiation source.

11. The EUV lithography system of claim 8, wherein the 3DDM includes a contamination monitor to monitor a contamination from target material droplets, and
    wherein the target material droplets are generated when the plasma is produced by the laser beam.

12. The EUV lithography system of claim 8, wherein the 3DDM includes photomultipliers, opto-isolators, integrated optical circuit (IOC) elements, photoresistors, photoconductive camera tubes, charge-coupled imaging devices, injection laser diodes, quantum cascade lasers, photo-emissive camera tube, or a combination thereof.

13. The EUV lithography system of claim 8, wherein the EUV control system further includes an analysis module designed to analyze the 3D laser beam profile and the 3D data of the plasma, and
    wherein the EUV control module includes:
        a laser alignment unit with a mechanism to adjust the 3D laser beam profile of the laser beam according to an analysis result from the analysis module;
        a targeting position control unit with a first mechanism to adjust delivery of a target material droplet;
        a laser pulse delay adjustment unit with a second mechanism to control generation of a laser pulse from the radiation source to synchronize the laser pulse and the target material droplet; and
        a vessel control unit with mechanisms to adjust at least one of a vessel pressure, a vessel flow rate, and a vessel temperature of the radiation source.

14. The EUV lithography system of claim 8, wherein the radiation source includes a laser source, an EUV module, and a laser-produced plasma (LPP) module enclosed in a space maintained in a hydrogen environment.

15. The EUV lithography system of claim 8, further comprising an exposure chamber maintained in a vacuum environment to perform a lithography exposure process using an EUV radiation generated by the plasma.

16. A method for an extreme ultraviolet (EUV) lithography system that includes a radiation source configured to generate an EUV radiation, comprising:
    collecting a laser beam profile of a laser beam from the radiation source in a 3-dimensional (3D) mode;
    performing an analysis to the laser beam profile, resulting in an analysis data; and
    adjusting the radiation source according to the analysis data to enhance the EUV radiation.

17. The method of claim 16, further comprising collecting 3D data of a plasma produced by the laser beam.

18. The method of claim 16, wherein the performing of the analysis includes modeling, correlation analysis, tool matching, machine learning, or a combination thereof.

19. The method of claim 16, wherein the adjusting of the radiation source according to the analysis data to enhance the EUV radiation includes adjusting the laser beam profile according to the analysis data by a laser alignment unit.

20. The method of claim 16, further comprising collecting laser beam profile variation over time.

* * * * *